Figure 3:
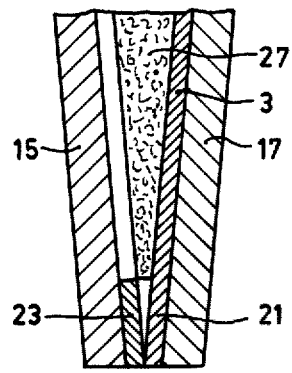

United States Patent [19]

Gustin et al.

[11] 4,300,146
[45] Nov. 10, 1981

[54] ELECTROSTATIC WRITE HEAD

[75] Inventors: Pol A. G. J. Gustin; Raymond G. G. Schayes, both of Brussels, Belgium

[73] Assignee: U.S. Philips Corporation, New York, N.Y.

[21] Appl. No.: 124,155

[22] Filed: Feb. 25, 1980

Related U.S. Application Data

[63] Continuation of Ser. No. 962,265, Nov. 20, 1978, abandoned.

[30] Foreign Application Priority Data

Dec. 6, 1977 [BE] Belgium ............................... 183188

[51] Int. Cl.³ ............................................ G01D 15/06
[52] U.S. Cl. ...................................... 346/155; 29/603
[58] Field of Search ......... 346/165, 139 C, 153.1–155; 29/603–604, 624–625, 592 R

[56] References Cited

U.S. PATENT DOCUMENTS

| Re. 26,212 | 5/1967 | Johnson et al. | 346/155 |
| 3,618,118 | 11/1971 | Lloyd | 346/155 |
| 3,626,422 | 12/1971 | Lloyd | 346/155 |
| 3,702,001 | 10/1972 | Gassino et al. | 346/165 |
| 3,903,594 | 9/1975 | Koneval | 29/603 |
| 3,984,844 | 10/1976 | Tanno | 346/76 R |

*Primary Examiner*—John H. Wolff
*Attorney, Agent, or Firm*—Robert S. Smith

[57] ABSTRACT

An electrostatic write head. An insulating plate-shaped substrate is provided with conductor tracks which extend as parallel conductor tracks in a strip-shaped region on the substrate. The substrate is divided into two plates according to a dividing line which extends in the strip-shaped region, perpendicularly to the conductor strips. The two plates are joined so that their sides provided with conductor tracks face each other.

2 Claims, 8 Drawing Figures

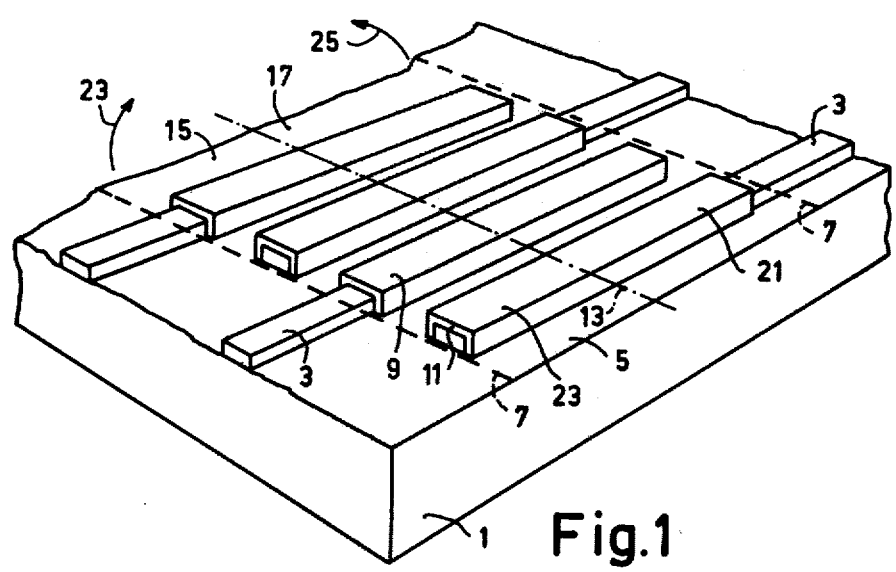

ELECTROSTATIC WRITE HEAD

This is a continuation of application Ser. No. 962,265, filed Nov. 20, 1978, now abandoned.

The invention relates to an electrostatic write head in accordance with which a flat, insulating plate is provided with conductor tracks, in a manner which is commonly used for the manufacture of boards comprising surface wiring in order to form write electrodes and connection conductors for these write electrodes. The write electrodes consist of mutually parallel end portions of the conductor tracks which terminate at an edge of the plate. The invention also relates to a write head thus manufactured.

A major problem encountered in the manufacture of electrostatic write heads consists in that on the one hand the distance between the electrodes should be as small as possible in order to obtain clearly legible writing or high resolution of the printed image, while on the other hand the conductors to be connected for connection of the electrodes to a control circuit may not be situated too near to each other. These problems can be partly solved by using the printed wiring technique during the manufacture. U.S. Pat. No. 3,618,118 describes an example in this respect, utilizing elongate printed circuit boards which are narrow at one end where the conductor tracks are situated near to each other to form the electrodes, while the other end is wider and accommodates connections. In order to form a write head, the narrow ends are adjacently arranged, so that the electrodes are arranged in one line, while the wide portions are arranged so as to imbricate. The accurate positioning of the narrow portions with respect to each other is time consuming and expensive, and the cross-section of the conductors constituting the electrodes is rectangular, so that the elements constituting the characters or images to be printed are line-shaped; however, square or circular elements are substantially less disturbing when the print is observed.

The invention has for its object to provide a method of the described kind which provides a write head in which the described drawbacks are eliminated.

To this end, the method in accordance with the invention is characterized in that a plate-shaped substrate is provided with conductor tracks which terminate in a strip-shaped region on the substrate, every two directly adjacently terminating conductor tracks entering the strip-shaped region from opposite directions, the parts of the conductor tracks situated in the strip-shaped region extending parallel to each other, the substrate being divided into two plates according to a dividing line which extends through the strip-shaped region, perpendicularly to the parts of the conductor tracks situated in this region, the two plates being rotated around the dividing line so that the sides accommodating conductor tracks face each other, an insulating layer being provided between the plates at the area of the connection conductors and the plates being connected to each other.

A first embodiment of a write head in accordance with the invention is characterized in that the write head consists of two plates provided with surface wiring, the surface wiring of each plate comprising a number of mutually parallel conductor strips which are situated at equal distances from each other and which terminate at an edge of the plate, one of every two directly adjacent conductor strips being extended to form a connection conductor, the other conductor strip having a length which amounts to only a few times its width, said plates being connected to each other so that their sides provided with surface wiring face each other, the arrangement being such that each conductor strip of the one plate which is provided with a connection conductor contacts a conductor strip of the other plate which is not provided with a connection conductor, thus forming a write electrode, an insulating layer being provided between the two plates at the area of the connection conductors.

A further embodiment of a write head in accordance with the invention which is distinguished by a very small distance between the electrodes is characterized in that the write head consists of two plates provided with surface wiring, the surface wiring of each plate comprising a number of mutually parallel conductor strips which are situated at equal distances from each other, which terminate at an edge of the plate and which are extended in order to form a connection conductor, said plates being connected to each other so that their sides provided with surface wiring face each other, the arrangement being such that each conductor strip of the one plate is situated halfway between two conductor strips of the other plate, with the exception of one of the outer conductor strips of each plate, said conductor strips forming a row of mutually parallel write electrodes, an insulating layer being provided between the two plates at the area of the connection conductors.

The invention will be described in detail hereinafter with reference to the accompanying diagrammatic drawing.

Figure 4:
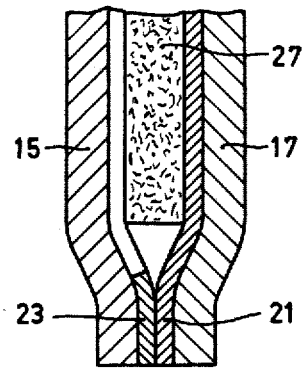
Figure 5:
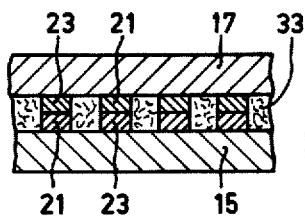
Figure 6:
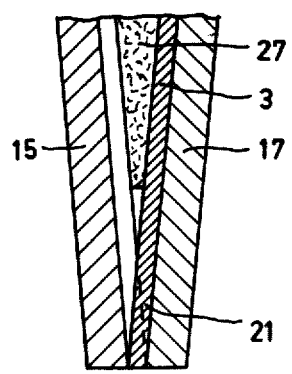
Figure 7:
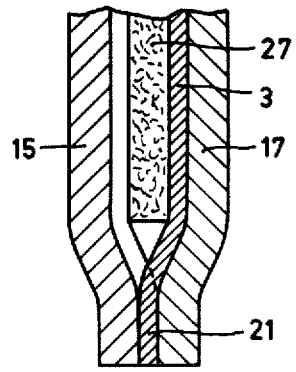
Figure 8:
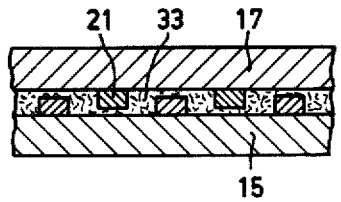

FIG. 1 is a perspective view at an increased scale of a part of a substrate provided with surface wiring which is used according to a preferred method in accordance with the invention, FIG. 2 is a cross-sectional view of a first embodiment of a write head in accordance with the invention, FIGS. 3 and 4 are cross-sectional views of two further embodiments, FIG. 5 is an end view of the write heads shown in the FIGS. 3 and 4, FIGS. 6 and 7 are cross-sectional views of two further embodiments yet, and FIG. 8 is an end view of the write heads shown in the FIGS. 6 and 7.

In accordance with the invention, a plate-shaped insulating substrate 1 is provided with conductor tracks 3 which terminate in a strip-shaped region 5 on the substrate, the boundaries of which are denoted by broken lines 7 in FIG. 1.

Each successive laterally adjacent track 3 enters the strip-shaped region 5 from an opposite direction and the parts 9 of the tracks situated in this region extend parallel to each other. The tracks 3 are provided on the substrate 1 by means of one of the known methods of manufacturing printed circuit boards. They are thickened by way of an additional metal layer 11 at the area of the region 5 in the embodiment shown in FIG. 1. The parts of the tracks 3 which are situated outside the region 5 form connection conductors. They connect the parts 9 to connections (not shown), for example, solder points or plated-through holes in the substrate 1 (not shown). FIG. 1 clearly shows that the distance between the tracks 3 outside the region 5 amounts to twice the distance between the tracks inside the region 5, so that connection to these tracks can be comparatively easily realised.

After provision of the additional metal layer 11, the substrate 1 is divided into two plates 15 and 17 according to a dividing line 13 (denoted as a stroke/dot line in FIG. 1) which extends through the strip-shaped region 5, perpendicularly to the tracks 9 in this region. The dividing line 13 intersects the track parts 9, so that each part is divided into a conductor strip 21 which is connected to a connection conductor, and a conductor strip 23 without a connection conductor. The two plates 15 and 17 are then rotated around the dividing line 13 in the direction of the arrows 25, so that the sides of the plates 15 and 17 accommodating conductor tracks (the upper side in FIG. 1) face each other. A conductor strip 23 without a connection conductor is then situated each time against a conductor strip 21 with a connection conductor. Because these two conductor strips originally formed a single track part 9, their dimensions are exactly the same and their positioning with respect to each other is automatically perfect.

At the area of the non-thickened tracks 3, forming the connection conductors, an insulating layer 27 is provided between the two plates 15 and 17, after which the assembly is joined, for example, by means of a suitable glue. FIG. 2 is a cross-sectional view of the write head thus formed. The thickened conductor strips 21 and 23 together form an approximately square write electrode which is capable, in conjunction with a counter electrode 29, of providing a point-shaped electrostatic charge image on the record carrier 31 in a known manner.

The substrate 1 may be made, for example, of fibreglass-reinforced epoxy resin, provided with copper tracks 3 having a thickness of 45 $\mu$m and a width of 90 $\mu$m. These tracks are electrolytically covered in the region 5 by a copper layer 11 having a thickness of 30 $\mu$m, so that the thickness of the parts 9 of the tracks amounts to 75 $\mu$m and their width to 150 $\mu$m. The electrodes then have a square section of 150×150 $\mu$m. The distance between the electrodes amounts to 100 $\mu$m, so that per mm four electrodes are provided.

It is alternatively possible to make electrodes having a smaller cross section by emission of the additional metal layer 11. However, in that case it is to be ensured that some clearance exists between the plates 15 and 17 at the area of the connection conductors in order to prevent short-circuiting or capacitive coupling between neighboring connection conductors of the two plates. To this end, the insulating layer 27 may be constructed to be wedge-shaped as shown in FIG. 3, the thinnest portion then being situated near the write electrodes.

Another possibility consists in the selection of a flexible foil of synthetic material for the plates 15 and 17, as shown in FIG. 4. The plates are then in contact with each other at the area of the write electrodes and are bent in different directions from this area and are furthermore separated from each other by a flat insulating layer 27.

The end view of the embodiments shown in the FIGS. 3 and 4 is the same. This is shown in FIG. 5. Between the ends of the conductor strips 21, 23 which serve as the write electrodes, a layer of glue 33 which joins the two plates is visible. This glue is, for example, an epoxy glue.

As a result of the arrangement of the conductor strips 21 and 23 against each other, the thickness of the write electrodes amounts to twice the thickness of these conductor strips. There are cases where doubling of the thickness is not required, for example, when substantially square write electrodes are not required because line-shaped print elements are acceptable, or when the electrodes are so narrow that their width substantially equals the thickness of a conductor track 3. In such cases the conductor tracks 3 can be made to terminate at the dividing line 13 (FIG. 1), so that the dividing line, rather than intersecting the tracks, is tangent thereto. Analogous to the construction shown in the FIGS. 3 and 4, rigid plates 15 and 27 can again be chosen in combination with a wedge-shaped insulating layer 27 (FIG. 6), or flexible plates with a flat, insulating layer (FIG. 7) can be chosen. The end view of the write head thus formed is shown in FIG. 8.

What is claimed is:

1. An electrostatic write head having a medium scanning end which is manufactured by providing an insulating plate having at least one side which is planar, providing a plurality of printed circuit type conductor tracks on said at least one side of the plate, said conductor tracks each terminating in a strip-shaped region on said plate, each successive laterally adjacent conductor track entering the strip-shaped region from opposite directions, and the parts of the conductor tracks situated inside the strip-shaped region extending parallel to each other, dividing the plate into first and second elements along a dividing line which extends through said strip-shaped region perpendicularly to and through each of said conductor tracks in said strip-shaped region, rotating the first and second elements relative to each other around the dividing line so that the sides thereof accommodating conductor tracks face each other, the ends of said conductor tracks proximate to said dividing line constituting the medium scanning end portion of said electrostatic write head, providing an insulating layer beween a portion of said first and second elements intermediate the conductor tracks at an area spaced from the dividing line, the conductor tracks in said region being mutually parallel and each track being spaced in the same direction from each laterally adjacent track and each track extending to an edge remote from said dividing line of said plate, the conductor tracks on said first element each being disposed in coplanar relationship with a conductor track on said second element, one of every two coplanar conductor strips respectively disposed on said first and second elements being extended to form a connection conductor, the other having a length which is no more than a few times the width thereof, said first and second elements being oriented with respect to each other with the sides thereof having conductor tracks disposed thereon facing each other, each conductor track on said first and second elements being provided with a connection conductor disposed proximate to a conductor track on the other element which is not provided with a connection conductor, said insulating layer being provided between the first and second elements in the region of the connection conductors, thereby providing an integral head.

2. An electrostatic write head as set forth in claim 1 wherein at least some of said conductor strips on said first element are disposed half-way between two adjacent conductor strips disposed on said second element.

* * * * *